United States Patent [19]

Amano et al.

[11] 4,345,240
[45] Aug. 17, 1982

[54] THROTTLE OPENING SENSOR

[75] Inventors: Hiroyuki Amano, Chiryu; Tsuyoshi Yoshida, Toyota; Kazuhiko Shibata, Anjyo, all of Japan

[73] Assignees: Aisin Seiki Kabushiki Kaisha; Aisin-Waner Kabushiki Kaisha, both of Aichi, Japan

[21] Appl. No.: 116,411

[22] Filed: Jan. 29, 1980

[30] Foreign Application Priority Data

Feb. 8, 1979 [JP] Japan .......................... 54-15119[U]

[51] Int. Cl.$^3$ ............................................ G08C 9/08
[52] U.S. Cl. ................................ 340/345; 340/347 P; 340/359; 340/364; 340/52 R
[58] Field of Search ............ 340/345, 364, 359, 347 P, 340/62, 52 R; 73/113, 114, 116; 364/442

[56] References Cited

U.S. PATENT DOCUMENTS

| | | | |
|---|---|---|---|
| 2,894,252 | 7/1959 | Lawhorn et al. | 340/52 R |
| 3,229,280 | 1/1966 | Chapin | 340/347 P |
| 3,487,460 | 12/1969 | Wheeler | 340/347 P |
| 3,683,368 | 8/1972 | Ebner | 340/347 P |
| 3,824,587 | 7/1974 | Fowler | 340/347 P |
| 3,898,649 | 8/1975 | Beck | 340/347 P |
| 4,037,219 | 7/1977 | Lewis | 340/347 P |
| 4,208,550 | 6/1980 | Wanger | 340/347 P |

Primary Examiner—James J. Groody
Attorney, Agent, or Firm—Sughrue, Mion, Zinn, Macpeak & Seas

[57] ABSTRACT

A signal generator is provided which produces a signal indicative of a throttle position of an engine on a vehicle. A plurality of split electrodes are formed on a printed electrical circuit substrate, and are connected with respective output leads. A less than 360° rotating shaft which is connected with a rotatable shaft of a throttle valve has secured thereto an electrically conductive slider having a plurality of radially extending legs which fixedly carry contact members disposed for contact with the plurality of split electrodes. Each contact member corresponds to only one split electrode. A lead which is connected to one of the split electrodes assumes a ground potential or a constant positive potential. Consequently, the potential of the slider is maintained at such ground or constant positive potential, while the remaining split electrodes assume the ground or the constant positive potential only when they are engaged by contact members on the slider. In this manner, the output is in the form of a bi-level signal, and the combination of outputs from the plurality of leads constitute together a code. The pattern of the plurality of split electrodes which provides a coded output is configured such that a change in the potential occurs only in one bit of the code for each rotation of the rotating shaft through a given angle. Thus, a Gray code is formed for the angle of rotation of the rotating shaft.

3 Claims, 5 Drawing Figures

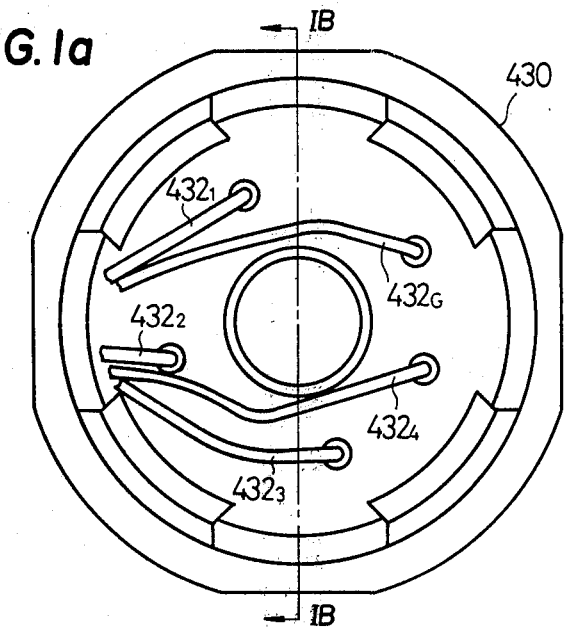
FIG. 1a
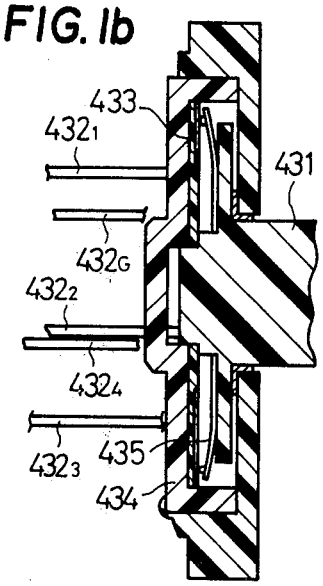
FIG. 1b
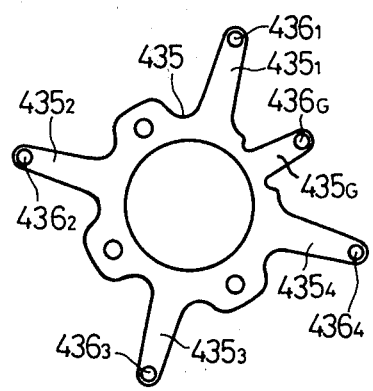
FIG. 1d
FIG. 2
| THROTTLE OPENING | OUTPUT CODE | | | |
|---|---|---|---|---|
| | $\theta_4$ | $\theta_3$ | $\theta_2$ | $\theta_1$ |
| 0 | 0 | 0 | 0 | 0 |
| 1 | 0 | 0 | 0 | 1 |
| 2 | 0 | 0 | 1 | 1 |
| 3 | 0 | 0 | 1 | 0 |
| 4 | 0 | 1 | 1 | 0 |
| 5 | 0 | 1 | 1 | 1 |
| 6 | 0 | 1 | 0 | 1 |
| 7 | 0 | 1 | 0 | 0 |
| 8 | 1 | 1 | 0 | 0 |
| 9 | 1 | 0 | 0 | 0 |
| 10 | 1 | 0 | 0 | 1 |
| 11 | 1 | 1 | 0 | 1 |
| 12 | 1 | 1 | 1 | 1 |
| 13 | 1 | 1 | 1 | 0 |
| 14 | 1 | 0 | 1 | 0 |
| 15 | 1 | 0 | 1 | 1 |

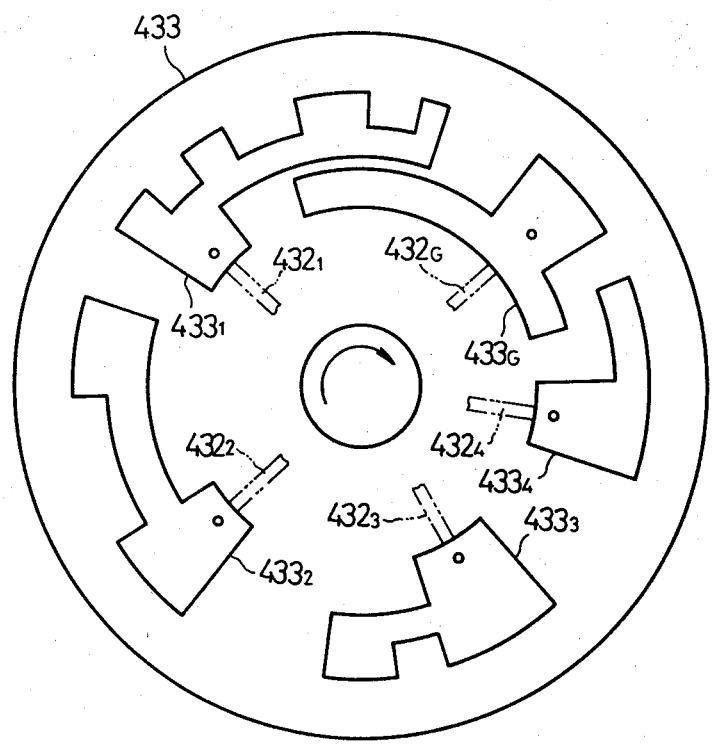

THROTTLE OPENING SENSOR

BACKGROUND OF THE INVENTION

The invention relates to a throttle opening sensor which produces a signal indicative of the throttle opening of an engine.

Of the throttle opening sensors known in the prior art, a potentiometer having a resistor film is most conventional. With this potentiometer type sensor, there is a problem that a premature abrasion of the resistor film is experienced. In an electronic digital control system which is utilized to control the fuel injection, the number of revolutions of the engine or the automatic transmission, it is necessary to provide an analog-digital converter which converts an output from the potentiometer into a digital code.

If a digital code generator or rotary type is formed, the individual split electrodes must be configured to produce a binary code representing a numerical value which is proportional to the throttle opening. With this binary code, if the throttle opening includes 16 steps from 0 to 15, it is necessary to provide a corresponding binary code as indicated in table 1 below.

TABLE 1

| Throttle Opening | Binary Code | Throttle Opening | Binary Code |
| --- | --- | --- | --- |
| 0 | 0000 | 8 | 1000 |
| 1 | 0001 | 9 | 1001 |
| 2 | 0010 | 10 | 1010 |
| 3 | 0011 | 11 | 1011 |
| 4 | 0100 | 12 | 1100 |
| 5 | 0101 | 13 | 1101 |
| 6 | 0110 | 14 | 1110 |
| 7 | 0111 | 15 | 1111 |

At transition between the steps of the throttle opening, the output code will represent a throttle opening which includes a significant deviation from the actual throttle opening. For example, in the Table 1 given above, between the throttle openings 3 and 4, the output code of the rotary code generator may be "0000" indicating an opening "0", "0111" indicating an opening "7" or "0110" indicating an opening "6". If a code produced which deviates from the actual opening, an erroneous operation of the electronic control system may result.

SUMMARY OF THE INVENTION

It is a first object of the invention to provide a throttle opening sensor having a high durability and capable of producing a digital code.

It is a second object of the invention to provide a throttle opening sensor capable of producing a code at the transition between the steps of the throttle opening which represents the actual throttle opening or a throttle opening adjacent thereto.

In accordance with the invention, a throttle opening sensor comprises a printed circuit substrate having a plurality of split electrodes formed thereon, a resilient conductor having a plurality of contacts, and a drive shaft for causing an angular movement of the resilient conductor relative to the substrate in response to an angular movement of a throttle valve. The plurality of split electrodes are formed in a pattern to generate a code such that the code which comprises a combination of the potentials of the split electrodes present a change in only one bit for each angular movement of the drive shaft which corresponds to the one step of the throttle opening.

BRIEF DESCRIPTION OF THE DRAWINGS

FIG. 1a is a plan view showing one embodiment of the invention;

FIG. 1b is a cross section taken along the line IB—IB shown in FIG. 1a;

FIG. 1c is an enlarged top view of a printed circuit substrate;

FIG. 1d is a plan view of a slider used in the embodiment of FIG. 1a; and

FIG. 2 is a chart indicating the code appearing on the output leads of the slider and representing a throttle opening.

DESCRIPTION OF PREFERRED EMBODIMENT

As shown in the drawings, a throttle opening sensor 430 of the invention includes a shaft 431 which is connected to the rotating shaft of the throttle valve for rotation therewith, a plurality of rotary contacts fixedly carried by the shaft, and a plurality of fixed contacts which are equal in number to the number of rotary contacts. It represents a digital code generator of potentiometer type. A plan view of the sensor 430 as viewed from the side thereof where lead wires are taken out is shown in FIG. 1a while a cross section thereof taken along the line IB—IB is shown in FIG. 1b. The digital code generator 430 is designed to produce a 4 bit code so as to indicate 16 steps of throttle openings 0–15. Four output leads $432_1$–$432_4$ which transmit the first to the fourth digit, respectively, as well as a single ground connection lead $432_G$ are connected to split electrodes printed on a disc-shaped printed circuit substrate 433, which is shown in an enlarged plan view in FIG. 1c. As shown, the substrate 433 is formed with split electrodes $433_1$–$433_4$ on which the first to the fourth digit of the binary output appear, as well as a split electrode $433_G$ which is connected with a plus potential (positive logic) or the ground potential (negative logic). The four split electrodes $433_1$–$433_4$ are disposed in different 90°-sectors of the substrate 433. The substrate 433 is fixedly mounted on a housing base 434. A slider 435 formed of a resilient material is fixedly mounted on the shaft 431, and is shown in plan view in FIG. 1d. As shown, the slider 435 is formed with four arms $435_1$–$435_4$ which are angularly spaced apart by 90°. Another arm $435_G$ is formed between the arms $435_1$ and $435_4$. The free end of these individual arms fixedly carry contact members $436_1$–$436_4$ and $436_G$, which are aligned with and engage the uneven, outermost portions of the split electrodes $433_1$–$433_4$ and an arcuate, innermost portion of the split electrode $433_G$, respectively, when the substrate 433 is mounted on the housing and the shaft 431 is mounted therein. Specifically, as the shaft 431 moves angularly over an extent of 90°, the contact member $436_G$ is maintained in engagement with the split electrode $433_G$ while the contact members $436_1$–$436_4$ move into or out of engagement with the corresponding split electrodes, depending on the outermost pattern of the respective electrodes. More specifically, considering the split electrode $433_1$, it assumes the positive potential or the ground potential when it is in engagement with the contact member $436_1$, whereby the lead $432_1$ which is connected therewith through a plating of a through-hole and an associated rear electrode also assumes the positive potential (or the ground potential). However, when it is not engaged by the contact member $436_1$, the lead $432_1$ as well as the split electrode $433_1$ assume the ground potential (or the positive potential). This can be achieved by connecting the lead wires $432_1$-$432_4$ to the ground through resistors, applying a positive voltage to the lead wire $432_G$, or applying a positive voltage to the lead wires $432_1$-$432_4$ through resistors while connecting the lead wire $432_G$ to the ground. In this manner, individual split electrodes $433_1$-$433_4$ are patterned to assume either a positive level or the ground level depending on the angular position of the shaft 431 and hence the slider 435. In the present embodiment, the angular extent of 90° for rotation of the shaft 431 is divided into 16 segments, to provide 16 steps of the throttle opening. More specifically, the patterns of the respective split electrodes $433_1$-$433_4$ are chosen so as to provide a Gray code shown in FIG. 2 by four bit outputs $\theta_1$-$\theta_4$ on the leads $432_1$-$432_4$ corresponding to the throttle opening 0-15. In this code, "0" represents a ground level and "1" a positive level. The purpose of choosing such pattern to provide a Gray code is to assure that a throttle opening which is represented by the outputs $\theta_1$-$\theta_4$ has no significant difference over the actual opening even if the contact members $436_1$-$436_4$ become momentarily or temporarily disengaged from the split electrodes $433_1$-$433_4$, respectively. By way of example, when the throttle opening changes from 3 (0010) to 4 (0110), in the transient condition until the contact member $436_3$ engages the split electrode $433_3$, the code indicative of the throttle opening remains to be 0010 so as to represent an opening 3, preventing an opening which significantly deviates from a value around the opening 4 to be indicated. If a normal binary denotation is employed, the opening 3 will be represented as 0011 and the opening 4 as 0100. When changing from 0011 to 0100, there will be produced those openings such as 0111 (opening 7), 0101 (opening 5), 0000 (opening 0), or 0001 (opening 1) which significantly deviate from either opening 3 or 4. However, with the throttle opening sensor 430, no such code will be produced which exhibits a significant deviation.

In the embodiment described above, the slider 435 formed of a resilient material is driven for rotation by a shaft which is mechanically associated with the rotation of the throttle valve. Alternatively, the slider 435 of the resilient material may be stationary while the printed substrate 433 may be driven by the shaft 431. As a further alternative, the split electrodes $433_1$-$433_4$ may be connected in common while the arms $435_1$-$435_4$ of the slider 435 may be separated and insulated from each other and connected with the leads $432_1$-$432_4$, respectively.

What is claimed is:

1. A throttle opening sensor comprising a printed circuit substrate having a plurality of angularly spaced apart split electrodes with each electrode having at least one radially outwardly projecting portion formed thereon and circularly disposed relative to each other, a resilient conductor having a plurality of radially extending arms equiangularly spaced apart with each arm having a contact which corresponds to only a respective split electrode, said contacts being circularly disposed for engagement with said projecting portions of said electrodes and a drive shaft for causing a limited angular movement less than 360° of one of the substrate and the resilient conductor relative to the other in mechanical association with a movement of the throttle valve as the latter is being opened or closed, the split electrodes being configured such that a code formed by a combination of contact or non-contact between the radially projecting outer portions of the individual split electrodes and the respective contacts exhibits a change in only one bit thereof for each angular movement of the drive shaft corresponding to one step of the throttle opening.

2. A throttle opening sensor according to claim 1 wherein said code comprises a Gray code.

3. A throttle opening sensor according to claim 1 further comprising an additional radially disposed arm on said resilient conductor having an additional contact thereon radially spaced from said circularly disposed contacts and an additional split electrode having an arcuate portion concentrically disposed relative to said circularly disposed contacts in alignment with said additional contact, said additional electrode being a constant potential electrode having a ground or a positive potential separated and insulated from the remainder of the split electrodes and having an arcuate length so as to be engaged by said additional contact throughout the full extent of its angular movement corresponding to the full extent of the angular movement of the throttle valve.

* * * * *